(12) United States Patent
Agrawal et al.

(10) Patent No.: US 9,093,190 B2
(45) Date of Patent: Jul. 28, 2015

(54) SYNTHESIS OF MULTINARY CHALCOGENIDE NANOPARTICLES COMPRISING CU, ZN, SN, S, AND SE

(75) Inventors: Rakesh Agrawal, West Lafayette, IN (US); Hugh W. Hillhouse, West Lafayette, IN (US); Qijie Guo, West Lafayette, IN (US)

(73) Assignee: PURDUE RESEARCH FOUNDATION, West Lafayette, IN (US)

( * ) Notice: Subject to any disclaimer, the term of this patent is extended or adjusted under 35 U.S.C. 154(b) by 662 days.

(21) Appl. No.: 13/321,835

(22) PCT Filed: May 26, 2010

(86) PCT No.: PCT/US2010/036261
§ 371 (c)(1),
(2), (4) Date: Feb. 22, 2012

(87) PCT Pub. No.: WO2010/138636
PCT Pub. Date: Dec. 2, 2010

(65) Prior Publication Data
US 2012/0138866 A1    Jun. 7, 2012

Related U.S. Application Data

(60) Provisional application No. 61/181,160, filed on May 26, 2009.

(51) Int. Cl.
*H01B 1/10*    (2006.01)
*H01L 31/00*    (2006.01)
(Continued)

(52) U.S. Cl.
CPC ............... *H01B 1/10* (2013.01); *C01B 19/002* (2013.01); *C23C 18/127* (2013.01);
(Continued)

(58) Field of Classification Search
CPC ........ H01B 1/00; H01B 1/10; H01L 31/0322; H01L 31/0326; H01L 21/02568; H01L 21/02601; C01B 19/002
USPC .......................... 252/519.14, 519.4; 423/508
See application file for complete search history.

(56) References Cited

U.S. PATENT DOCUMENTS

| | | | |
|---|---|---|---|
| 8,366,975 B2 * | 2/2013 | Johnson et al. | 252/519.51 |
| 8,470,287 B2 * | 6/2013 | Ionkin | 423/508 |
| 2010/0319776 A1 * | 12/2010 | Choe et al. | 136/262 |

FOREIGN PATENT DOCUMENTS

| | | |
|---|---|---|
| EP | 2040305 A2 * | 3/2009 |
| WO | WO 2007 134843 | 11/2007 |
| WO | WO 2008 021604 | 2/2008 |

OTHER PUBLICATIONS

Altosaar et al "Cu2Zn1-xCdxSn(Se1-ySy)4 solid solutions as absorber materials for solar cells", Phys. Stat. Sol.(a), No. 1, 167-170, 2008.*
Altosaar et al "Cu2ZnSnSe4 monograin powders for solar cell application", Proc. IEEE WCPEC-4, Hawaii, 2006 pp. 468-470.*
Fan et al "Linearly arranged polytypic CZTSSe nanocrystals", Scientific Reports, 2:952, Dec. 2012, pp. 1-6.*
International Search Report, PCT/US2010/036261, Jan. 25, 2011.
International Preliminary Report on Patentability, PCT/US2010/036261, Nov. 29, 2011.
(Continued)

*Primary Examiner* — Mark Kopec
(74) *Attorney, Agent, or Firm* — Brinks Gilson & Lione

(57) ABSTRACT

Nanoparticle compositions and methods for synthesizing multinary chalcogenide CZTSSe nanoparticles containing Cu, Zn, and Sn in combination with S, Se or both are described. The nanoparticles may be incorporated into one or more ink solutions alone or in combination with other chalcogenide-based particles to make thin films useful for photovoltaic applications, including thin films from multilayer particle films having a composition profile. The composition and stoichiometry of the thin films may be further modified by subjecting the particle films to gas or liquid phase chalcogen exchange reactions.

10 Claims, 9 Drawing Sheets

(51) Int. Cl.
  *C01B 19/00*    (2006.01)
  *C23C 18/12*    (2006.01)
  *H01L 21/02*    (2006.01)
  *H01L 31/032*   (2006.01)
(52) U.S. Cl.
  CPC ... *H01L 21/02568* (2013.01); *H01L 21/02601* (2013.01); *H01L 21/02628* (2013.01); *H01L 31/0322* (2013.01); *H01L 31/0324* (2013.01); *Y02E 10/541* (2013.01)

(56) References Cited

OTHER PUBLICATIONS

Araki et al., "Preparation of $Cu_2ZnSnS_4$ thin films by sulfurization of stacked metallic layers", Thin Solid Films, vol. 517, 2008, pp. 1457-1460.

Wibowo et al., "Pulsed laser deposition of quaternary $Cu_2ZnSnSe_4$ thin films", Phys. Stat. Sol. (a), vol. 204, No. 10, 2007, pp. 3373-3379.

* cited by examiner

US 9,093,190 B2

SYNTHESIS OF MULTINARY CHALCOGENIDE NANOPARTICLES COMPRISING CU, ZN, SN, S, AND SE

This application is a National Stage application of International Application No. PCT/US2010/036261 filed May 26, 2010, which claims the benefit of U.S. Provisional Application No. 61/181,160, filed May 26, 2009, the entire contents of which are hereby incorporated herein by reference.

FIELD OF THE INVENTION

This invention is related to the compositions and methods for synthesizing and using multinary chalcogenide CZTSSe nanoparticles containing Cu, Zn, Sn, S, and Se, namely $Cu_2ZnSn(S_y,Se_{1-y})_4$, where $0 \le y \le 1$. The nanoparticles may be used in for making thin films useful for photovoltaic applications.

BACKGROUND

Among the various semiconductor nanomaterials investigated for photovoltaic applications, one of the more promising candidates for low cost solar cells is the I-III-VI$_2$ family of chalcopyrite nanocrystals, particularly $Cu(In,Ga)Se_2$ (3, 5, 6). Thin film solar cells based on $Cu(In,Ga)Se_2$ has reach photon to electron conversion efficiency as high as 19.9% (13). However, due to the limited supply and ever increasing price of rare metals such as indium and gallium, there's need to find alternative materials with high abundance and low cost. Recently, few selective groups have started investigating $Cu_2SnZnS_4$ (CZTS) and $Cu_2SnZnSe_4$ (CZTSe) thin films for photovoltaic applications. CZTS and CZTSe are especially attractive because of tin and zinc's natural abundance in the earth's crust and they are of relatively low toxicity. Solar cell based on CZTS has achieved photon to electron conversion efficiency as high as ~6.7% and expecting further increases (8). Various high-vacuum and non-vacuum based techniques similar to that of $Cu(In,Ga)Se_2$ absorber have been investigated for the deposition of CZTS thin films, such as vacuum co-evaporation and selenization of various precursor layers (1, 2, 9, 15, 16, 18). However, such deposition methods are problematic for high throughput fabrication as evidenced by the slow progress in mass production of $Cu(InGa)Se_2$-based solar cells.

Recently, synthesis and in some cases photovoltaic applications of various semiconductor nanocrystals has been reported, such as $Cu_2S$, (14), (CdTe, (7), Pb(S,Se)(11, 12), and various I-III-VI$_2$ chalcopyrite compounds, such as $CuInSe_2$ (6), $Cu(In,Ga)Se_2$ (3, 10, 17), and $Cu(In,Ga)S_2$ (4, 5). Recent reports demonstrated the ability to synthesize various multinary chalcogenide nanocrystals and inks based on Cu, In, Ga, S, and Se for high efficiency thin film solar cells (4, 5, 6). In such nanoparticles, both In and Ga belong to the same column of the Periodic Table (CAS Version, CRC Handbook Version, CRC Handbook of Chemistry and Physics) and have a valency of three. The inter substitution of In and Ga in the lattice essentially exchanges one element with another having the same valency. By forming nanoparticles of Cu(In,Ga)(S,Se)$_2$, the composition of the films is fixed at length scales equivalent to the nanoparticle size which can lead to device quality absorber films reproducibly while taking the advantages of a solution based process.

There is a need in the art for simple and scalable synthesis of multinary nanoparticles comprising of copper (Cu), zinc (Zn), tin (Sn), sulfur (S), and selenium (Se) suitable for photovoltaic applications. The present invention provides compositions and methods for synthesizing multinary chalcogenide CZTSSe nanoparticles containing Cu, Zn, Sn, S, and Se.

SUMMARY

In one aspect, the present invention provides a composition containing a plurality of discrete CZTSSe nanoparticles denoted by $Cu_2ZnSn(S_y,Se_{1-y})_4$, where $0 \le y \le 1$ (herein denoted as CZTSSe). The composition may be stoichiometric or non-stoichiometric. The composition may be formulated in a nanoparticle ink solution suitable for forming thin film coatings on a substrate from a monolayer or multilayer composite precursors. The nanoparticle ink solution may include a mixture of at least two different pluralities of particles, including a plurality of a first CZTSSe nanoparticle and a plurality of a second particle. The second particle may include the same or different CZTSSe nanoparticle, a CZTSSe family particle (comprising at least one of Cu, Zn, Sn, S, Se), a CIGSSe nanoparticle, or a multinary $I_B$-$II_B$/$II_A$-$IV_A$-$VI_A$ type nanoparticle.

In another aspect, the present invention provides a method for synthesizing a CZTSSe nanoparticle composition. In one embodiment, a first set of precursors containing Cu, Zn, and Sn, is suspended in a solvent to form a first precursor solution, and a second set of precursors containing S and/or Se is suspended in a solvent to form a second precursor solution. The first and second sets of precursors (or precursor solutions) are reacted together in one or more solvents under conditions sufficient for forming a plurality of CZTSSe nanoparticles denoted by $Cu_2ZnSn(S_y,Se_{1-y})_4$, where $0 \le y \le 1$. Alternatively, the first and second sets of precursors may be mixed in a single solvent to form a single precursor solution or reaction mixture which can be used at elevated temperatures or conditions sufficient for forming the plurality of CZTSSe nanoparticles.

The first set of precursors may include: (i) an elemental form of Cu, Zn, Sn, or combination thereof; (ii) a metal or metal alloy of Cu, Zn, Sn, or combination thereof; (iii) a metal salt of Cu, Zn, Sn, or combination thereof; (iv) organic complex of Cu, Zn, Sn, or combination thereof; and (v) a metal chalcogenide of Cu, Zn, Sn, or combination thereof. The second set of precursors may include: (i) an elemental form of S, Se, or combination thereof; (ii) a compound of S, Se, or combination thereof; or (iii) a complex of S, Se, or combination thereof. Exemplary solvents include alkanes, alkenes, alkane derivatives, alkene derivatives, and combinations thereof, including alkane or alkene derivatives having at least one amine, carboxylic acid, ether, phosphine, phosphonic acid, or thiol.

In another aspect, a method for forming a thin film formed from a monolayer of CZTSSe nanoparticles includes depositing a layer of CZTSSe particles and annealing the layer of the particles to form a CZTSSe thin film. In another embodiment, a method for forming a thin film formed from a bilayer or multilayer composite precursor includes depositing a first layer of CZTSSe nanoparticles and depositing on the substrate at least a second layer of particles comprised of a plurality of a second particle. The second particle may be the same as the CZTSSe nanoparticles in the first layer, a different CZTSSe nanoparticle, or another type of particle, such as a CZTSSe family particle, a CIGSSe nanoparticle, or a multinary $I_B$-$II_B$/$II_A$-$IV_A$-$VI_A$ nanoparticle. Following a terminal annealing step, a CZTSSe thin film is formed having a distinct composition profile.

Particle layers may be deposited on the substrate from one or more ink solutions, any one of which may contain a plurality of single type of particle or a mixture of two or more particles. Further, the deposition of any given particle layer may be accompanied by additional treatment steps, for example, to remove organic and inorganic additives used during the formulation of the ink, etc. Exemplary treatments include chemical treatment, heat treatment, etching, washing, and combinations thereof.

When forming the thin films described herein, a source of at least one chalcogen may be provided in an annealing step to promote a chalcogen exchange reaction which can further modify the composition and stoichiometric properties of the film. The chalcogen exchange/annealing step may be carried out at a temperature between about 50° C. to about 650° C., and preferably between about 350° C. to about 550° C. for a gas phase chalcogen exchange reaction and between about 200° C. to about 350° C. for a liquid phase chalcogen exchange reaction. Exemplary chalcogen sources for the chalcogen exchange reaction include elemental chalcogen sources in vapor form, powder, flakes, or pellets; chalcogen compounds; (2) metal chalcogenides, including sulfides, selenides, and tellurides, and various binary, ternary, and quaternary compounds thereof; (4) chalcogen complexes; (5) chalcogen-containing particles or particle layers, including CZTSSe family particles, CIGSSe nanoparticles; and (6) chalcogen containing layers mixed with one or more elemental chalcogen sources; and combinations thereof.

BRIEF DESCRIPTION OF THE DRAWINGS

FIG. 6 depicts TEM images of CZTS nanocrystals synthesized at 200° C.

DETAILED DESCRIPTION

Definitions

Figure 1:
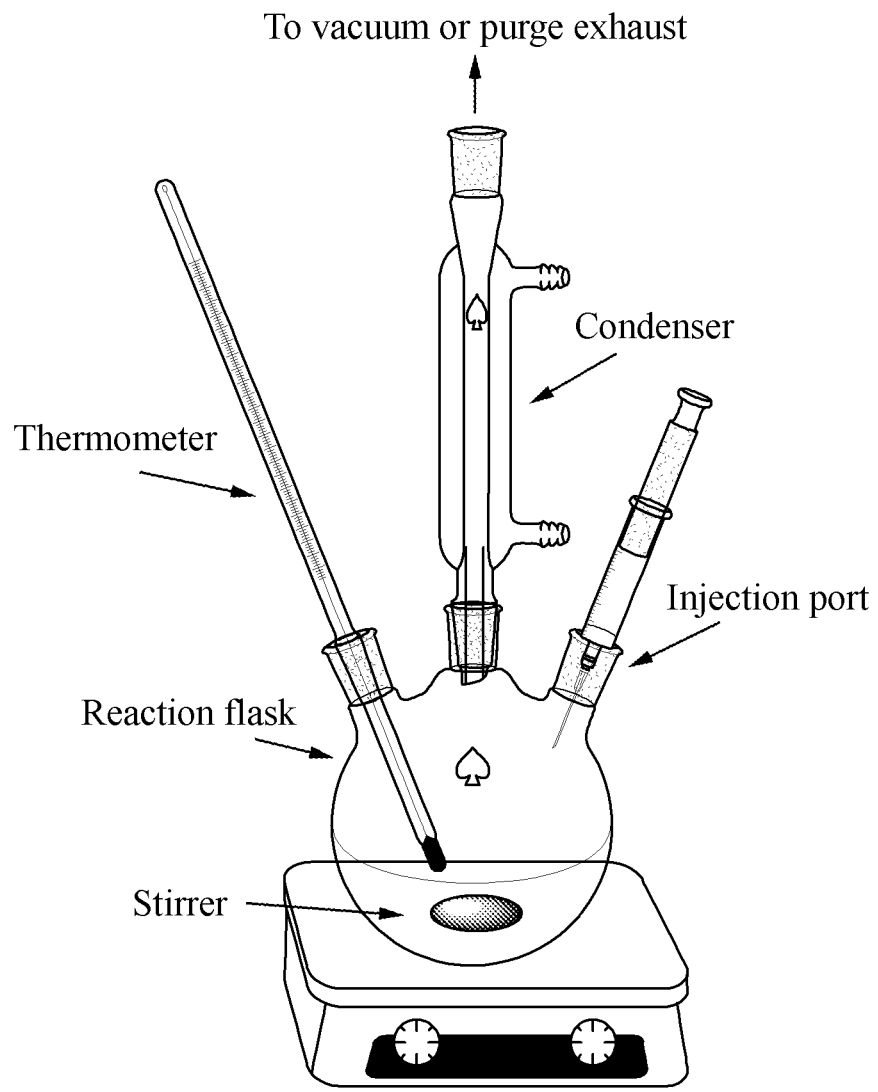
FIG. 1 is a schematic diagram illustrating an example of the synthesis of CZTSSe nanoparticles according to an embodiment of the present invention.

In order to provide a clear and consistent understanding of the specification and claims, the following definitions are provided.

As used herein, the term "nanoparticle" means a particle or crystal with at least one dimension having a size between about 1 nm to about 1000 nm, between about 1 nm to 100 nm, between about 1 nm to about 25 nm, or between about 1 nm to about 15 nm.

As used herein, the term "CZTSSe" refers to a CZTSSe nanoparticle, coating layer containing CZTSSe nanoparticles, or a CZTSSe-based thin film having a chemical composition denoted by $Cu_2ZnSn(S_y Se_{1-y})_4$, where $0 \leq y \leq 1$ (where S, Se or both are present).

As used herein, the term "CZTS" refers to a CZTS nanoparticle, coating layer containing CZTS nanoparticles, or a CZTS-based thin film, where S is the only chalcogen present.

As used herein, the term "CZTSe" refers to a CZTSSe nanoparticle, coating layer containing CZTSe nanoparticles, or a CZTS-based thin film, where Se is the only chalcogen present.

As used herein, the term "CZTSSe family" refers to a particle comprising Cu, Zn, Sn, S, Se, or combination thereof.

As used herein, the term "CIGSSe" refers to a CIGSSe nanoparticle having a chemical composition denoted by $Cu(In_{1-x}Ga_x)(S_{1-y}Se_y)_2$, where $0 \leq x \leq 1$ and $0 \leq y \leq 1$.

As used herein, the term "multinary $I_B$-$II_B$/$II_A$-$IV_A$-$VI_A$" refers to a nanoparticle comprising at least one element from each of Groups $I_B$, $II_B$+$II_A$, $IV_A$ and $VI_A$ in the Periodic Table (CAS Version, CRC Handbook Version, CRC Handbook of Chemistry and Physics).

As used herein, the term "layer" refers to the deposition of particles, such as from an ink solution, for example, whereby the particles are deposited so as to fully or at least partly cover another layer or substrate.

As used herein, the term "stoichiometric" may be applied to a solid film of a material, such as a layered superlattice material or thin film; or a precursor for forming a material, such as a thin film coating, thin film coating layer, or a nanoparticle composition or mixture as contained in a nanoparticle ink solution, for example. When applied to a solid thin film, "stoichiometric" refers to a formula showing the actual relative amounts of each element in a final solid thin film. When applied to a precursor, it indicates the molar proportion of metals in the precursor. A stoichiometric formula may be balanced or unbalanced. A "balanced" stoichiometric formula is one in which there is just enough of each element to form a complete crystal structure of the material with all sites of the crystal lattice occupied, though in actual practice there may typically be some defects in the crystal at room temperature. An unbalanced "stoichiometric" formula is one in which the molar proportions of exhibit an excess and/or deficiency in one element relative to another element.

As used herein, the term "precursor" may be used with reference to an organic or inorganic compound or solution utilized as a reactant in nanoparticle synthesis, or with reference to thin film prior to a terminal annealing step.

As used herein, the term "conductive substrate" refers to either substrate, including a conductive layer thereon, or a substrate made of a conductive material.

CZTSSe Nanoparticles and their Synthesis

The present invention provides compositions and methods for synthesizing metal chalcogenide CZTSSe nanoparticles comprised of Cu, Zn, Sn, S, and Se, more specifically compositions comprising a plurality of discrete CZTSSe nanoparticles having a chemical composition denoted by $Cu_2ZnSn(S_y Se_{1-y})_4$, where $0 \leq y \leq 1$. It should be noted that in contrast to In and Ga in $Cu(In,Ga)(S,Se)_2$ (CIGSSe) nanoparticles, Zn and Sn in CZTSSe have different valences, Zn having a valency of 2, and Sn having a valency of 4.

The CZTSSe nanoparticles may be further characterized by the following atomic ratios:

$$\frac{Cu}{Zn+Sn} = X_1; \frac{Zn}{Sn} = X_2; \frac{Cu}{S+Se} = X_3; \text{ and } \frac{2(S+Se)}{Cu+2Zn+4Sn} = X_4.$$

In one embodiment, the present invention provides stoichiometric CZTSSe nanoparticles, where each of $X_1$, $X_2$, and $X_4$ is 1, and $X_3$ is 0.5.

The present invention further provides non-stoichiometric CZTSSe nanoparticles. Non-stoichiometric CZTSSe nanoparticles may contain molar ratios of one or more elements in excess or deficiency relative to a stoichiometric CZTSSe nanoparticle. Thus, a non-stoichiometric CZTSSe nanoparticle may be copper (Cu) rich, Cu poor, zinc (Zn) rich, Zn poor, tin (Sn) rich, Sn poor, chalcogen rich, or chalcogen poor. In a Cu rich CZTSSe, $X_1$ is >1; in a Cu poor CZTSSe, $X_1$ is <1. Similarly, in a Cu rich CZTSSe, $X_3$ is >½, while in a Cu poor CZTSSe, $X_3$ is <½. In a Zn rich CZTSSe, the $X_2$ is >1, while in a Zn poor CZTSSe, $X_2$ is <1. In a Sn rich CZTSSe, $X_2$ is <1, while in a Sn poor CZTSSe, $X_2$ is >1. In a chalcogen (S+Se) rich CZTSSe, $X_4$ is >1 (i.e., total amount of chalcogen>1 to balance the stoichiometry), while in a chalcogen poor CZTSSe, $X_4$ is <1 (i.e. total amount of chalcogen<1 to balance the stoichiometry).

CZTSSe nanoparticles may contain S, Se, or both. In CZTS nanoparticles where y is 1, there is no Se. In contrast, in CZTSe nanoparticles where y is 0, there is no S.

In a further aspect, the present invention provides method for synthesizing CZTSSe nanoparticle compositions, including CZTSSe nanoparticle ink solutions. CZTSSe compositions of the present invention may be formulated as nanoparticle ink solutions suitable for forming a thin film coating on a substrate as further described below. Typically, a nanoparticle ink solution may be formulated so that the nanoparticle concentration in the ink solution ranges between about 0.1 to 50% by volume, preferably between about 0.1 to 20% by volume.

In one embodiment, the synthesis of CZTSSe nanoparticles is carried out by reacting a first set of metal precursors with a second set of chalcogen precursors in one or more compatible solvents under conditions sufficient to form a plurality of CZTSSe nanoparticles denoted by $Cu_2ZnSn(S_ySe_{1-y})_4$, where 0≤y≤1. The reaction may be carried out above room temperature, at a temperature of about 50° C. to about 350° C., preferably between about 150° C. to about 300° C.

The first set of metal precursors may include precursors and/or combinations comprising Cu, Zn, Sn, including but not limited to elemental metal forms of Cu, Zn, Sn; metal alloys of Cu, Zn, Sn; metal salts of Cu, Zn, Sn, including halides (e.g., chlorides, iodides), such as copper chloride, tin chloride, and zinc chloride, acetates, such as copper acetate, sulfates, such as copper sulfate, nitrates, such as copper nitrate; organometallic complexes of Cu, Zn, Sn, such as copper acetylacetonate and tin bis(acetylacetonate)dibromide; metal chalcogenides of Cu, Zn, Sn, including sulfides, selenides, and tellurides, as well as binary, ternary, and quaternary compounds thereof, including $Cu_2O$, ZnO, $Cu_2S$, $Cu_2Se$, SnO, ZnS, $Cu_2SnS_3$, and $Cu_4SnS_4$; and combinations therefrom.

The second set of chalcogen precursors may include one or more precursors and/or combinations comprising S, Se, or both. The chalcogen precursors may include elemental chalcogen in the form of flakes, pellets or powder; chalcogen compounds, including $H_2S$, $Na_2S$, $Na_2Se$, $H_2Se$, diethyl selenium, thiourea, and selenourea; metal chalcogenides, including sulfides, selenides, and tellurides, as well as binary, ternary, and quaternary compounds thereof, including $Cu_2O$, ZnO, $Cu_2S$, $Cu_2Se$, SnO, ZnS, $Cu_2SnS_3$, and $Cu_4SnS_4$; chalcogen complexes, including oleylamine-sulfur complex, trioctylphosphine-sulfur complex, and trioctylphosphine selenium complex.

Each of the first and second sets of precursors may be suspended in one or more compatible solvents to form respective precursor solutions. Alternatively, both the first and second sets of precursor may be suspended in a compatible solvent or solvent mixture to form a single precursor solution. Exemplary solvents include, but are not limited to alkanes, alkenes, alkane derivatives, alkene derivatives, and combinations thereof. Further, non-coordinating solvents (such as alkanes and alkenes) may be used in conjunction with coordinating ligands providing functional groups, such as amines, carboxylic acids, ethers, phosphines, phosphine oxides, phosphonic acids and thiols. By way of example, in one embodiment, a non-coordinating solvent, such as octadecene may be used with oleic acid as the coordinating ligand.

FIG. 1 is a schematic illustration of an exemplary experimental apparatus for synthesizing CZTSSe nanoparticles. FIG. 1 depicts a round-bottom flask having three necks. One neck is connected to a thermometer or thermocouple for monitoring the reaction temperature within the reaction flask. A second neck is connected to a condenser, which is connected to a Schlenk line (not shown), i.e., a manifold which connects to a vacuum pump and an inert gas supply. This arrangement allows the connected apparatus to be purged with inert gas by switching between vacuum and inert gas flows. Purging may be done by switching the system to a vacuum mode for a desired amount of time and then switching back to an inert gas flow to backfill the flask. The inert gas backfills the flask because the pressure inside the flask is lower than in the vacuum. A third neck is shown as being sealed with a rubber stopper, the third neck serving as an injection port for the addition of desired precursors. A heating mantle or oil/sand bath may be used to heat the flask. A magnetic stirrer may be placed inside the flask to keep the reaction mixture well mixed.

In one embodiment, the first set of precursors may be suspended in a solvent to form a first precursor solution and the second set of precursors may be suspended in or provided in a secondary precursor solution, whereby the first and second precursor solutions are combined to form a reaction mixture which can be incubated at a sufficiently high temperature (e.g., 150° C. to about 300° C.) under conditions suitable for forming nanoparticles, including nanocrystals. Nanoparticles or nanocrystals may be collected by centrifugation following reaction of the first precursor solution with the second precursor solution.

The size, shape, composition, compositional parameters (y, $X_1$, $X_2$, $X_3$, $X_4$), and stoichiometric properties of the CZTSSe nanoparticles may be controlled by varying the metal precursors, chalcogen precursors, solvents, and synthesis conditions, as further described herein.

In another embodiment, CZTSSe and CZTSe nanoparticles (and ink solutions therefrom) may be synthesized from CZTS nanoparticles by replacing sulfur with selenium in part or full via a liquid phase chalcogen exchange reaction (see below) following synthesis where Se or S precursors (as described herein) are included with the synthesized CZTSSe nanoparticles.

In an exemplary CZTSSe nanoparticle synthesis embodiment, a first set of metal precursors containing Cu, Zn, and Sn is suspended in one or more compatible solvents to form a metal precursor solution that is heated under vacuum at about 100° C. to about 150° C., degassed for about 30 minutes and purged with argon gas several times. At this point the temperature may be raised to between about 200° C. to about 300° C., whereupon a second set of chalcogen precursors in solution containing S, Se, or both are added to the metal precursor solution. The reaction mixture is then allowed to proceed to completion whereupon the reaction mixture is cooled to between about 50° C. to about 100° C. Nanoparticles, including nanocrystals may be collected by centrifugation in a suitable solvent or solvent mixture, such as 3:1 mixture of isopropanol and toluene.

A nanoparticles or nanocrystal precipitate may be redispersed in a suitable solvent, such as toluene, to form a stable nanoparticles or nanocrystal ink solution. A nanoparticle ink solution may further contain various additives, such as dispersants, levelers, anti-oxidants, surfactants, and others apparent to those skilled in the art. Nanoparticle ink solutions may be used to form single and multilayer thin films as further described below. A nanoparticle ink solution may contain a single type of CZTSSe nanoparticle defined by a characteristic set of parameter values (y, $X_1$, $X_2$, $X_3$, $X_4$) or it may contain two or more types of CZTSSe nanoparticles, including one type of CZTSSe nanoparticle defined by a first set of parameter values ($y_a$, $X_{1a}$, $X_{2a}$, $X_{3a}$, and $X_{4a}$), and at least one other CZTSSe type nanoparticle defined by a second set of parameter values ($y_b$, $X_{1b}$, $X_{2b}$, $X_{3b}$, and $X_{4b}$). In this context, CZTSSe nanoparticles may be considered different when at least one of the parameters has different values between the two sets. The nanoparticle ink solution may also be a mixture of CZTSSe nanoparticles of a certain set values of (y, $X_1$, $X_2$, $X_3$, $X_4$) with other nanoparticles from the CZTSSe family of materials.

A CZTSSe nanoparticle ink solution may further include other particles, including CZTSSe family particles containing one or more Cu, Zn, Sn, S and/or Se elements. For example, the ink solution may be a mixture of CZTSSe nanoparticles with metal particles of Cu, Zn, Sn, S, and/or Se, alloys therefrom, and combinations therefrom. In another embodiment, the ink solution may be a mixture of CZTSSe nanoparticles with chalcogenide particles, including binary, ternary, quaternary, and/or higher chalcogenide particles of Cu, Zn and Sn or combinations thereof, as well as oxides, sulfides, selenides, and tellurides. Exemplary chalcogenide particles include, but are not limited to $Cu_2O$, ZnO, $Cu_2S$, $Cu_2Se$, SnO, ZnS, $Cu_2SnS_3$, and $Cu_4SnS_4$.

The other CZTSSe family nanoparticles and ink solutions thereof may be synthesized in a similar method described in the present invention by reacting corresponding metal and chalcogen precursors in compatible solvent or solvents. The overall composition of the other CZTSSe family nanoparticles, may be stoichiometric, copper rich or poor, Zn rich or poor, Sn rich or poor, and chalcogen rich or poor, as described above.

A CZTSSe nanoparticle ink solution may further include other chalcogen particles, including $Cu(In_{1-a}Ga_a)(S_bSe_{1-b})_2$ nanoparticles (where $0 \leq a \leq 1$ and $0 \leq b \leq 1$) denoted herein as CIGSSe nanoparticles, and multinary $I_B$-$II_B/II_A$-$IV_A$-$VI_A$ nanoparticles, where $I_B$, $II_B/II_A$, $IV_A$ and $VI_A$ include their respected groups or columns of elements in the Periodic Table, as further described below. CIGSSe nanoparticles are based on copper (Cu), indium (In), gallium (Ga), sulfur (S), and selenium (Se), and include nanoparticles comprising $CuInS_2$, $CuInSe_2$, $CuGaS_2$, $CuGaSe_2$, $Cu(In_{1-x}Ga_x)S_2$, $Cu(In_{1-x}Ga_x)Se_2$, and $Cu(In_{1-x}Ga_x)(S_{1-y}Se_y)_2$, where $0 \leq x \leq 1$ and/or $0 \leq y \leq 1$, and are further described in US Patent Application Publication No. US 2010-0003187 A1, the disclosure of which is incorporated by reference herein.

Thin Film Coatings Containing CZTSSe Nanoparticles

In another aspect, the present invention provides thin film compositions and coating methods employing the use of CZTSSe nanoparticles or ink solutions thereof as described herein. In one embodiment, a method for forming a thin film comprises depositing a layer of any of the CZTSSe particles described herein, and annealing the layer of the particles to form a CZTSSe thin film. The layer of CZTSSe nanoparticles may be deposited on the substrate in the form of a nanoparticle ink solution. The CZTSSe layer may be of uniform composition or it may comprise a mixed composition of particles, including a plurality of a CZTSSe nanoparticle and a plurality of a second particle as further described below.

In another embodiment, thin film compositions may be formed from a plurality of particle layers to form a thin film having a distinct composition profile. In one embodiment, a plurality of a first CZTSSe nanoparticle is deposited on the substrate to form a first layer of particles, and a plurality of at least a second particle is deposited on the substrate to form a second layer of particles, where the first and second layers of particles are annealed to form a CZTSSe thin film having a composition profile, and where at least one of the first layer, second layer, or both comprises a plurality of CZTSSe particles.

In another embodiment, a method for forming a thin film comprises depositing a layer of any of the CZTSSe particles described herein, providing a source of at least one chalcogen, and annealing the layer of the particles in the presence of the at least one chalcogen to form a CZTSSe thin film having a distinct composition profile. In this case, the annealing step is performed in a chalcogen atmosphere at an elevated temperature to promote chalcogen exchange in one or more layers deposited on the substrate. The chalcogen exchange step can be used to form CZTSSe-, CZTS-, and CZTSe-based thin films from a variety of different nanoparticles or nanoparticle layers. By way of example, CZTSSe-based thin films may be synthesized from CZTS nanoparticles by providing conditions suitable for partial exchange of S by Se, so as to form CZTSSe-based thin films having both S and Se. This may be achieved by providing a suitable environment (or atmosphere) providing a source of Se precursors. CZTSe-based thin films may be formed by providing conditions suitable for full exchange of S by Se in the CZTS-containing layers, such that Se becomes the only chalcogen in the CZTSSe-based thin film. Thus, CZTSe nanoparticles can be synthesized by fully replacing all sulfurs in the CZTS nanoparticle layer(s). Likewise, CZTS-based thin films can be formed from CZTSe nanoparticle layers by providing conditions suitable for full exchange of S by Se in the CZTS-containing layer(s), such that S becomes the only chalcogen in the CZTS-based thin film.

Either of the above coating methodologies may involve deposition of CZTSSe nanoparticles directly on the substrate or they may involve direct deposition of CZTSSe nanoparticles on another layer of particles. At least one of the first layer, second layer, or both may be deposited on the substrate from one or more ink solutions as described above. In a preferred embodiment, each layer of particles is deposited from a corresponding ink solution. Accordingly, the first layer may be deposited on the substrate from a first ink solution, and at least a second layer may be deposited on the substrate from a second ink solution.

The CZTSSe layer may be deposited as a composition or ink solution of uniform composition or it may be deposited as a mixed composition of particles, including a plurality of a CZTSSe nanoparticle and a plurality of a second particle as further described below. Ink solutions containing CZTSSe nanoparticles can be applied directly to desired substrates or other particle layers using various methods known to those skilled in the art, such as drop casting, spray coating, inkjet printing, roll coating, knife coating, spin coating, dip coating, web coating, and the like (and combinations thereof). Exemplary substrates included but not limited to glass, metal, plastic, glass coated with metal, plastic coated with metal, and combinations thereof. The substrate may be configured in various shapes known to those skilled in the art, including as a sheet, such as a foil sheet, cylinder, etc.

A single coating layer of particles may have thickness ranging from between about 2 nm to about 4 µm. The total thickness of the overall single-layer or multi-layer precursor coating(s) may range from about 4 nm to about 8 µm, preferably from about 500 nm to about 4 µm. Following annealing, chalcogen exchange, and/or additional processing steps, the resulting film may be reduced by about 50% in thickness relative to the overall thickness of the precursor coating(s), between about 200 nm and about 2 µm.

After depositing any (or all) particle layer(s), the particle layer may be subjected to chemical treatment, heat treatment, etching, washing, or combination thereof. The heat treatment may be performed under a desired atmosphere of choice, including vacuum, inert, reducing, or oxidizing atmosphere to remove, for example, organic and inorganic additives used during the formulation of the ink solution used for the particle layer (this heat treatment step is to be distinguished from the annealing step performed in the presence of chalcogen source). A washing step may be similarly used after depositing any (or all) particle layer(s) to remove the organic and inorganic additives used during the formulation of the ink. In addition, solutions containing solvents or etchants may be used after depositing any (or all) particle layer(s) for the selective removal of certain additives used when formulating an ink associated therewith. Such methods may include, for example, the use of a soxhlet extractor, as well as other techniques and apparatuses known to those skilled in the art.

Figure 7:
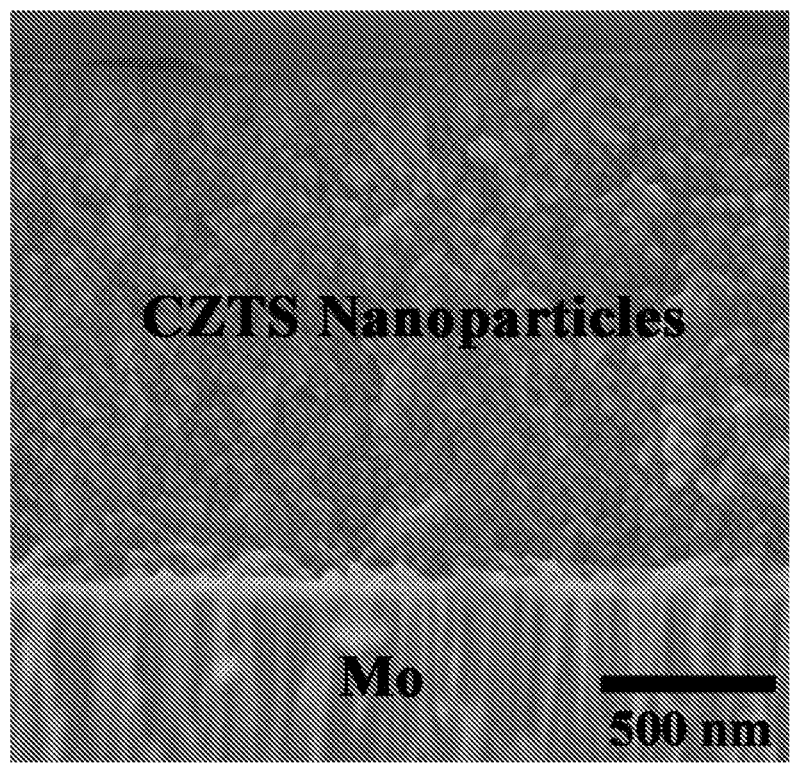
FIG. 7 depicts an FE-SEM image of a thin film coating of CZTS nanoparticles on molybdenum coated soda lime glass.

By way of example, an ink solution containing CZTS nanoparticles may be deposited on a substrate, such as molybdenum coated soda lime glass, successively as independent layers (each ~750 nm thick), whereby each of two successively deposited layers is separately annealed in an inert (argon) atmosphere at about 350° C. for 1 hour. As shown in FIG. 7, a dense CZTS nanoparticle film can be obtained throughout the entire thickness of the film.

In a further embodiment, as described above, an annealing step may be performed in a chalcogen atmosphere at an elevated temperature to promote chalcogen exchange when coating a substrate with one or more layers of particles, including at least one layer comprising a plurality of chalcogens, including CZTSSe nanoparticles according to the present invention. The incorporation of a chalcogen exchange step can be used to form CZTSSe-, CZTS-, and CZTSe-based thin films. By way of example, CZTSSe-based thin films may be synthesized from CZTS nanoparticles by providing conditions suitable for partial exchange of S by Se, so as to form CZTSSe-based thin films having both S and Se. This may be achieved by providing a suitable environment (or atmosphere) providing a source of Se precursors. CZTSe-based thin films may be formed by providing conditions suitable for full exchange of S by Se in the CZTS-containing layers, such that Se becomes the only chalcogen in the CZTSSe-based thin film. Thus, CZTSe nanoparticles can be synthesized by fully replacing all sulfurs in the CZTS nanoparticle layer(s). Likewise, CZTS-based thin films can be formed from CZTSe nanoparticle layers by providing conditions suitable for full exchange of S by Se in the CZTS-containing layer(s), such that S becomes the only chalcogen in the CZTS-based thin film.

The chalcogen atmosphere in the present embodiment may include one or more chalcogens or chalcogen sources, the chalcogens being selected within group $VI_4$ of the Periodic Table (see CAS Version, CRC Handbook Version, CRC Handbook of Chemistry and Physics), particularly S, Se, and Te. Exemplary sources of chalcogen(s) for the annealing step may include elemental chalcogen sources in vapor form, or as flakes or powder; chalcogen compounds, including or gaseous derivatives thereof, including $H_2S$, $Na_2S$, $Na_2Se$, $H_2Se$, diethyl selenium, thiourea, and selenourea; metal chalcogenides, including sulfides, selenides, and tellurides, as well as binary, ternary, and quaternary compounds, including $Cu_2O$, $ZnO$, $Cu_2S$, $Cu_2Se$, $SnO$, $ZnS$, $Cu_2SnS_3$, and $Cu_4SnS_4$; chalcogen complexes, including oleylamine-sulfur complex, trioctylphosphine-sulfur complex, and trioctylphosphine selenium complex; chalcogen-containing particles or particle layers, including CZTSSe family particles, CIGSSe nanoparticles, and other chalcogen containing layers, including alternating layers thereof; elemental chalcogen sources mixed with other chalcogen particle layers; and combinations of any one or more chalcogen sources described herein.

A chalcogen exchange step may be performed either in a gas phase or liquid phase reaction. Further, the temperature for chalcogen exchange may range between about 50° C. to about 650° C. For gas phase reactions, the temperature for chalcogen exchange may range between about 250° C. and about 650° C., more preferably between about 350° C. and about 550° C. For liquid phase reactions, the temperature for chalcogen exchange may range between about 50° C. to about 400° C., preferably between about 150° C. and about 400° C., and more preferably between about 200° C. and about 350° C.

Figure 8:
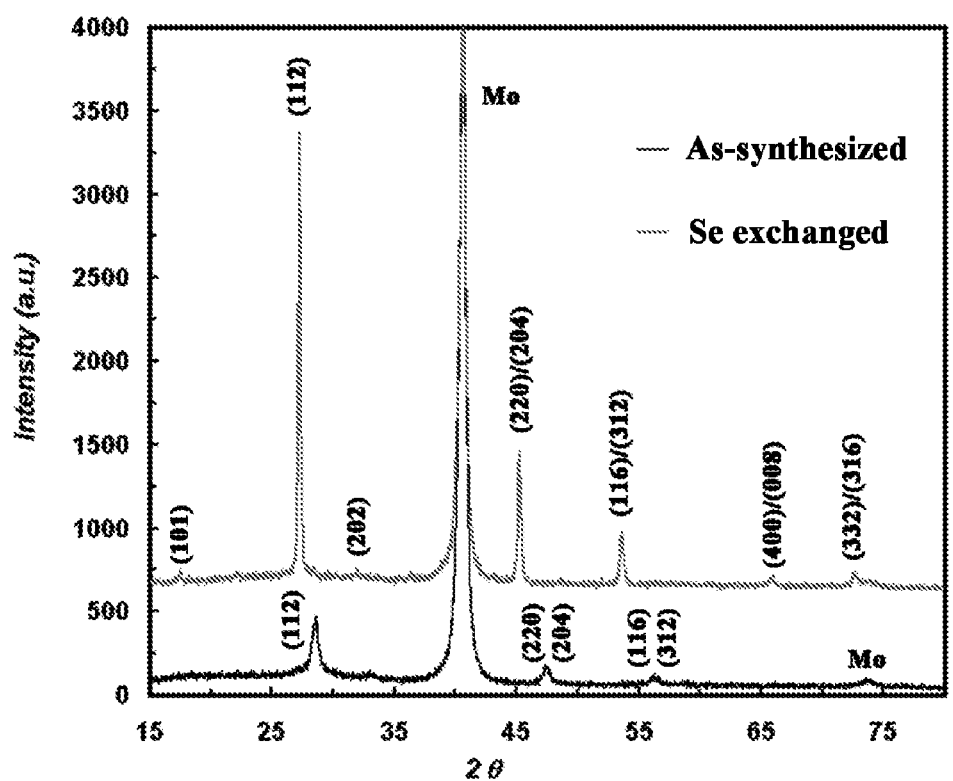
FIG. 8 depicts a PXRD from a selenium exchanged CZTS nanoparticle thin film coating on molybdenum coated soda lime glass after annealing in a Se containing atmosphere.

By way of example, chalcogen exchange in a thin film coating of CZTS nanoparticles on molybdenum coated soda lime glass may be carried out in a graphite box containing Se vapor environment at a temperature between about 350° C. to about 550° C. Although not essential for carrying out chalcogen reaction, the use of graphite box can advantageously confine the Se vapor during chalcogen exchange. Additionally, the graphite box can provide a uniform heating for the sample during chalcogen exchange, inasmuch as graphite is a black body absorber. A PXRD pattern of Se exchanged CZTS nanoparticle thin film is shown in FIG. 8. After Se exchange, the diffraction peaks were found to be shifted to the left due to the increase in lattice parameters coincident with replacement of S by Se. Minor peaks, including peaks (101) and (202) are also evident in the Se exchanged film. Further, major peaks including (112) were sharpened after Se exchange, indicative of recrystallization and growth of the CZTS nanoparticles.

The degree of chalcogen exchange may be controlled by varying the reaction conditions, particularly temperature, time, and concentration(s) of chalcogen reactants. By degree of chalcogen exchange we mean the ratio of the different chalcogens before and after exchange reaction, which could be anything greater or equal to 0. For example, typically ~95% of the sulfur in a ~1.5 micrometer thick CZTS nanoparticle coating may be exchanged with Se by annealing under a Se vapor in a graphite box at 500° C. for 20 minutes. Use of a higher temperature or increased time of exchange or increased chalcogen concentration may replace more S with Se.

As described above, the present invention provides a number of thin film embodiments and synthesis methodologies, including one embodiment in which the thin film is formed from a single layer of CZTSSe nanoparticles deposited on a substrate. The single layer may be limited in composition to one CZTSSe nanoparticles type or it may contain a mixture of particles, including a plurality of one CZTSSe nanoparticle and at least a second particle as further described herein.

In another embodiment, the thin film may be formed from a plurality of at least two or more particle layers that are the same or different so as to form a thin film having a distinct composition profile. Deposition of layers arising from the same composition of particles may provide a composition profile when subjecting the individual layers to the different treatments as described above. Deposition of layers arising from different composition of particles may provide a composition profile by virtue of the compositional differences reflected in the individual layers following annealing with or without a chalcogen environment.

As described above, a plurality of a first CZTSSe nanoparticle may be deposited on a substrate to form a first layer and a plurality of a second particle may be deposited on the substrate to form a second layer. The CZTSSe nanoparticles may be directly deposited on the substrate, or they may directly deposited on the plurality of the second particle forming the second layer. At least one of the first layer, second layer, or both may be deposited on the substrate from one or more ink solutions as described above.

Thin film coatings containing CZTSSe nanoparticles may be prepared using different inks of CZTSSe nanoparticles with different values of the parameters set $(y, X_1, X_2, X_3, X_4)$. The two inks of CZTSSe nanoparticles are said to have different values of the parameter set $(y, X_1, X_2, X_3, X_4)$ when at least one of the parameters $y, X_1, X_2, X_3$, and $X_4$ is different between the nanoparticles contained in the two inks. In general, two parameter sets, a $(y_a, X_{1a}, X_{2a}, X_{3a}, X_{4a})$ and b, $(y_b, X_{1b}, X_{2b}, X_{3b}, X_{4b})$ are said to be different when at least one of the parameters has different values between the two sets. Thus, two or more inks may be used to create different composition depth profiles by coating two or more layers whereby at least two layers have nanoparticles with different values of the parameter set $(y, X_1, X_2, X_3, X_4)$. Thus one can create thin films with a desired composition depth profile with desired variation in the concentration of one or more elements from Cu, Zn, Sn, S and Se. In case of solar cells, this will be done to maximize the performance of the solar cells.

In one embodiment, the plurality of the second particle may include a second CZTSSe nanoparticle. In this case, the first CZTSSe nanoparticle may be characterized by a first parameter value set defined by members of the group consisting of $y_a, X_{1a}, X_{2a}, X_{3a}$, and $X_{4a}$, including a first parameter value. The second CZTSSe nanoparticle may be characterized by a second parameter value set defined by members of the group consisting of $y_b, X_{1b}, X_{2b}, X_{3b}$, and $X_{4b}$, including a second parameter value corresponding in type to the first parameter value, yet different in value relative to the first parameter value. In another embodiment, the first CZTSSe nanoparticle comprises a third value defined by members of the first parameter value set, and the second CZTSSe nanoparticle comprises a fourth parameter value defined by the members of the second parameter value set, the third and fourth values corresponding in type to one another, where the third value is substantially the same as the fourth value.

In another embodiment, the plurality of the second particle may include a CZTSSe family particle, a CIGSSe nanoparticle, or a multinary $I_B$-$II_B$/$II_A$-$IV_A$-$VI_A$ nanoparticle as described above. Further, the "second particle" (as described) may be additionally deposited as a mixture in conjunction with any of the CZTSSe nanoparticles described herein.

When forming the CZTSSe thin film coatings, particles may be selected to form a thin film coating where the overall composition of the thin film coating is substantially stoichiometric or where the overall composition is characterized by an atomic ratio having a non-stoichiometric atomic ratio, such that $X_1>1$, $X_1<1$, $X_2>1$, $X_2<1$, $X_4>1$, and/or $X_4<1$.

$I_B$-$II_B$/$II_A$-$IV_A$-$VI_A$-Based Nanoparticles, Inks, and Nanoparticle-Based Coatings The methods for preparing coatings containing CZTSSe nanoparticles and/or utilizing chalcogen exchange as described herein can be adapted for making other multinary chalcogenide nanoparticles using other suitable metals- and/or chalcogen precursors, including those containing aluminum (Al), iron (Fe), manganese (Mn), oxygen (O), silver (Ag), and tellurium (Te).

In particular, the methods for preparing nanoparticles, nanoparticle inks, and nanoparticle-based coatings can be adapted for preparing $I_B$-$II_B$/$II_A$-$IV_A$-$VI_A$-based nanoparticles, nanoparticle inks, and nanoparticle-based coatings, where $I_B$, $II_B$/$II_A$, $IV_A$, and $VI_A$ include one or more elements from each of these respective groups (or columns) in the periodic table. For example, when more than one element are used from a given column then from $I_B$ one may simultaneously have Cu and Ag, from $II_B$ one may simultaneously have Zn and Cd, from $IV_A$ one may simultaneously have Sn and Ge, and from $VI_A$ one may simultaneously have S and Se, in the nanoparticles. The $I_B$-$II_B$/$II_A$-$IV_A$-$VI_A$ nanoparticles may be used to make thin films as described for CZTSSe above.

In one embodiment, $I_B$-$II_B$-$IV_A$-$VI_A$-based nanoparticles, inks, and coatings comprising the same may be used in accordance with the CZTSSe methodologies described herein. In other embodiments, one may use divalent cations from $II_A$ to replace some or all of the elements from group $II_B$ in the $I_B$-$II_B$-$IV_A$-$VI_A$ nanoparticles.

Similar to the CZTSSe synthesis methodology described above, $I_B$-$II_B$/$II_A$-$IV_A$-$VI_A$ nanoparticles, including $I_B$-$II_B$-$IV_A$-$VI_A$ nanoparticles, $I_B$-$II_A$-$IV_A$-$VI_A$ nanoparticles, and coatings derived therefrom may be prepared using a plurality of different inks containing different -$II_B$/$II_A$-$IV_A$-$VI_A$ nanoparticles, $I_B$-$II_B$-$IV_A$-$VI_A$ nanoparticles, $I_B$-$II_A$-$IV_A$-$VI_A$ nanoparticles with one another or in conjunction with the other particles described herein. Two inks of $I_B$-$II_B$/$II_A$-$IV_A$-$VI_A$ nanoparticles are said to be different when their molecular formulas, compositions, or stoichiometries are different between the nanoparticles contained in the two inks. As with the CZTSSe nanoparticles described above, two or more inks may be used to create different composition depth profiles by coating two or more layers where at least two layers have $I_B$-$II_B$-$IV_A$-$VI_A$ nanoparticles with different composition or where two identical layers are differently treated following deposition as described above. Thus one can create thin films with a desired composition depth profile with desired variation in the concentration of one or more elements from groups $I_B$-$II_B$/$II_A$-$IV_A$-$VI_A$. In case of solar cells, this will be done to maximize the performance of the solar cells.

Further, in additional embodiments, a nanoparticle compositions or ink solutions therefrom may include a mixture of at least two different pluralities of particles, including a plurality of a first multinary $I_B$-$II_B$/$II_A$-$IV_A$-$VI_A$ nanoparticle and a plurality of a second particle, including a second multinary $I_B$-$II_B$/$II_A$-$IV_A$-$VI_A$ nanoparticle, a CZTSSe nanoparticle, a CZTSSe family particle, and a CIGSSe nanoparticles.

Likewise, multinary $I_B$-$II_B$/$II_A$-$IV_A$-$VI_A$-based nanoparticles and ink solutions may be deposited as a first layer in conjunction with other multinary $I_B$-$II_B$/$II_A$-$IV_A$-$VI_A$ nanoparticles in a second layer when forming multilayer coatings.

Alternatively, a multinary $I_B$-$II_B$/$II_A$-$IV_A$-$VI_A$ nanoparticle may be deposited as a first layer in conjunction with the deposition of other nanoparticles in a second layer, which may include CZTSSe nanoparticles, CZTSSe family particles, CIGSSe nanoparticles, or combinations thereof. For example, one may coat a layer of $I_B$-$II_B$-$IV_A$-$VI_A$ nanoparticles and then a layer of CIGSSe nanoparticles (or first coat a layer of CIGSSe nanoparticles and then a layer of $I_B$-$II_B$-$IV_A$-$VI_A$ nanoparticles) to create a composite thin film having a distinct composition profile. It is also possible to create an ink containing both $I_B$-$II_B$-$IV_A$-$VI_A$ and CIGSSe nanoparticles and then use this mixture ink to create single layer or multi-layer thin film coatings. Such a mixture ink may be easily prepared by mixing an ink containing one or more CIGSSe nanoparticles with the same or different a and/or b and an ink containing one or more $I_B$-$II_B$-$IV_A$-$VI_A$ nanoparticles with different compositions.

Photovoltaic Applications of CZTSSe Nanoparticles

CZTSSe nanoparticles synthesized using the methods described in the present invention have suitable optical properties, and can be used as the light absorber in a photovoltaic device. The types of photovoltaic devices include but not limited to all-inorganic solar cells (preferably thin film solar cells), organic-inorganic hybrid solar cells (for example an mixture of CZTSSe nanoparticles with conducting polymers), and photoelectrochemical solar cells (for example, electrochemical solar cell of a CZTSSe thin film in a polyelectrolyte solution) as known by those practicing the art.

The nanoparticle-based thin films synthesized using the methods described in the present invention have suitable optical properties, and can be used as the light absorber in a photovoltaic device. The types of photovoltaic devices include but not limited to all-inorganic solar cells (preferably thin film solar cells), organic-inorganic hybrid solar cells (for example an mixture of the nanoparticles herein with conducting polymers), and photoelectrochemical solar cells (for example, electrochemical solar cell of a thin film in a polyelectrolyte solution) as known by those of skill in the art.

Following annealing in a Se and/or S containing atmosphere, an absorber will have electronic and optical properties suitable for further fabrication to form a functional photovoltaic device. When fabricating a photovoltaic device, device fabrication steps may include a variety of different steps. When forming a photovoltaic cell, a thin film according to the present disclosure is deposited on a substrate. The substrate may be flexible or rigid. Flexible substrates include but are not limited to high thermal stability polymers, such as polyimides, polymer composites, metal foils, and the like. Rigid substrates include but are not limited to sodalime glass, borosilicate glass, fused silica, quartz, thick metal foils, steel, carbon fiber composites, and the like. The substrate may first be coated with an opaque or transparent conducting layer to form a conducting substrate. Exemplary conducting layers include metals, including but not limited to molybdenum, aluminum, gold silver, copper, tin, zinc, indium, gallium, tungsten, nickel, and cobalt, conducting polymers; carbon nanotube composites, graphene, and conducting oxides, including but not limited to tin doped indium oxide, fluorine doped tin oxide, and aluminum doped zinc oxide. Alternatively, the thin film may be deposited on a conductive substrate where substrate may be made of a conductive material.

The conducting substrate may be coated with any of the above-described nanoparticle-based coating layers, which may be further subjected to additional chemical or thermal treatments as described above. A second semiconductor layer may then be deposited to form a semiconductor junction. The second semiconductor layer may be deposited by a variety of methods including vapor deposition, spray pyrolysis, chemical bath deposition, electrodeposition, nanoparticle ink coating, or other solution phase deposition methods. The second semiconductor layer may include but is not limited to CdO, CdS, CdSe, CdTe, ZnO, ZnS, ZnSe, ZnTe, SnO, $Sn_{O2}$, SnS, $S_{n2}S$, SnSe, $SnS_{e2}$, SnTe, $SnT_{e2}$, CuO, $Cu_2O$, CuS, $Cu_2S$, CuSe, $Cu_2Se$, CuTe, $Cu_2Te$, CZTSSe, CIGSSe, and combinations thereof. The second semiconductor layer may also be deposited before depositing the particle-based coating layers to from an absorber. Upon deposition of the particle-based layers and the second semiconductor layer, an opaque or transparent conducting layer may be deposited. Alternatively, the second semiconductor layer may be omitted entirely to form a Schottky junction photovoltaic device containing a thin film according to the present disclosure.

In one embodiment, a method for fabricating a photovoltaic cell includes providing a conductive substrate; forming a thin film according to any of the above-described embodiments on the substrate, and forming a top electrode on the substrate, whereby at least one of the conductive substrate and top electrode is transparent. A second semiconductor layer may be further deposited on the substrate.

In an exemplary inorganic solid cell embodiment, a CZTSSe thin film in accordance with the teachings herein may be formed on a rigid or flexible conductive substrate. A buffer layer including but not limited to CdS, ZnS, InS, GaS, SnS, $Cd_xZn_{1-x}S$, can be deposited on top of the resulting CZTSSe to form the p-n junction. A top transparent conducting electrode and busbars can then be deposited on the buffer layer in accordance with photovoltaic cell fabrication methodologies known to those of skill in the art.

The examples of photovoltaic devices presented herein are useful in highlighting the benefits of the present invention. However, applications of the technology described herein should not be construed as being limited to photovoltaic devices, but may be used in other non-solar related electronic devices.

EXAMPLES

Example 1

CZTS Nanoparticles Synthesis

In an exemplary CZTS nanoparticle synthesis, 10 ml of oleylamine (technical grade, Aldrich) containing a mixture of copper(II) acetylacetonate (1.5 mmol; 99.99%, Aldrich), zinc acetylacetonate (0.75 mmol of 99.995%, Aldrich), and tin (IV) bis(acetylacetonate)dibromide (0.75 mmol; 98%, Aldrich) was added into a 100 ml three neck flask connected to a Schlenk line. The mixture was heated to ~130° C. under vacuum, degassed for 30 minutes, and purged with Ar several times. After raising the temperature 200° C.-245° C., 3 ml of 1 M sulfur solution (in oleylamine) was injected through the third neck. Following injection, the reaction mixture was allowed to proceed for 30 minutes to completion. The heating mantle was then removed and the mixture was cooled to ~80° C. The resulting nanocrystals were collected by centrifugation in a 3:1 mixture of isopropanol and toluene. The precipitate was then redispersed in ~40 ml toluene to form a stable nanoparticle ink solution.

Figure 2:
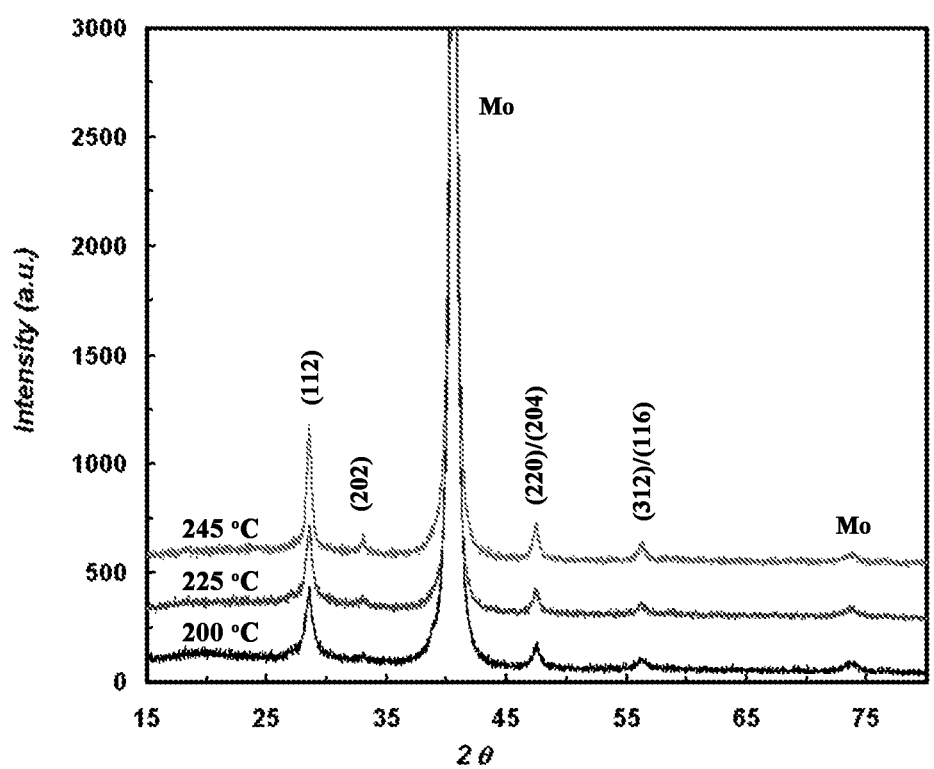
FIG. 2 depicts a PXRD from CZTS nanoparticles synthesized at various temperatures showing the expected peaks from the CZTS crystal structure. The PXRD sample was taken using molybdenum substrates.

FIG. 2 shows the PXRD pattern of CZTS nanoparticles synthesized at various temperatures according to Example 1. The diffraction peaks are indexed corresponding to the stannite crystal structure of CZTS and agrees very well with the JCPD reference data (PDF#26-0575). The stannite structure can be derived from the chalcopyrite structure of $CuInSe_2$ by replacing half of In with Zn and the other half with Sn. The crystal size estimated from the FWHM of (112) peak is ~14 nm.

Figure 3:
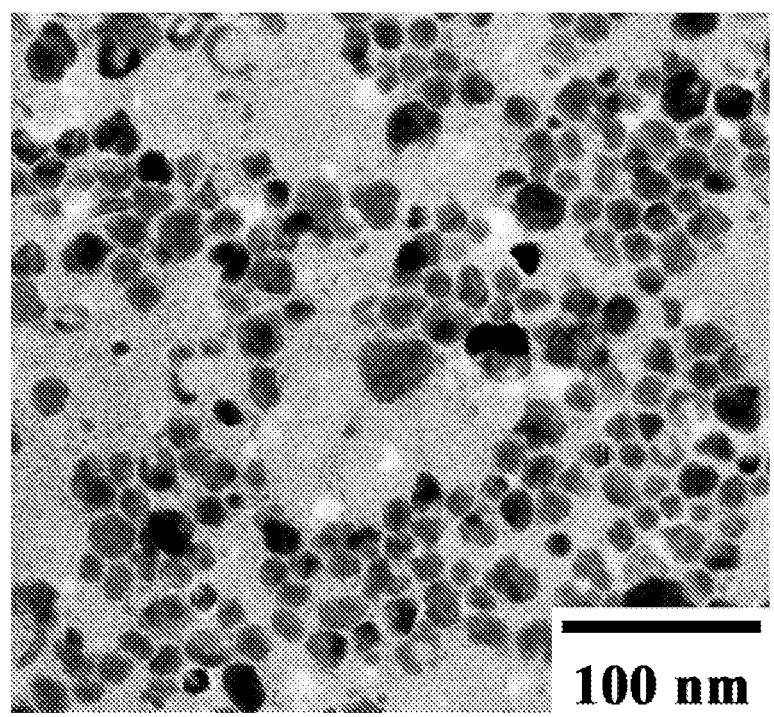
FIG. 3 depicts a TEM image of CZTS nanoparticles synthesized without size selective separation process.

FIG. 3 shows a TEM image of CZTS nanoparticles synthesized without size selective separation. The CZTS nanoparticles can be seen as irregularly shaped and slightly polydispersed in a range of about 10-25 nm, in accordance with the estimated crystalline size from PXRD. The averaged composition of the CZTS nanoparticles was $Cu_{2.12}Zn_{0.84}Sn_{1.06}S_4$, as determined using energy dispersive X-ray spectroscopy (EDX). The CZTS nanoparticles are slightly copper rich ($X_1$=1.12), zinc poor ($X_2$=0.79), and slightly chalcogen poor ($X_3$=0.53).

Example 2

Cu-Poor, Zn Rich CZTS Nanoparticle Synthesis

Figure 4:
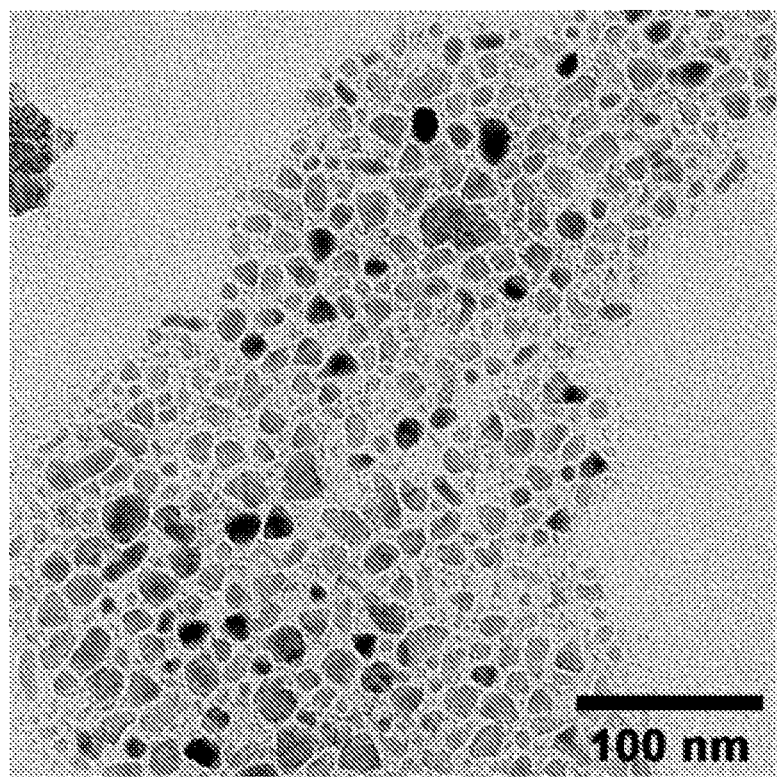
FIG. 4 depicts a TEM image of $Cu_{1.48\pm0.08}Zn_{2.19\pm0.16}Sn_{0.91\pm0.03}S_4$ nanoparticles.

The ratios of Cu:Zn:Sn in CZTS nanoparticles can be varied by changing the relative amounts of the metal precursors used in the synthesis. In one example, 10 ml of oleylamine (technical grade, Aldrich) containing a mixture of copper(II) acetylacetonate (0.75 mmol; 99.99%, Aldrich), zinc acetylacetonate (0.75 mmol; 99.995%, Aldrich), and tin(IV) bis(acetylacetonate)dibromide (0.5 mmol; 98%, Aldrich) was added into a 100 ml three neck flask connected to a Schlenk line. The mixture was heated to ~130° C. under vacuum, degassed for 30 minutes, and purged with Ar several times. After raising the temperature to about 235° C., 2 ml of 1M sulfur solution (in oleylamine) was injected through the third neck. Following injection, the reaction mixture was allowed to proceed for 30 minutes for completion. The heating mantle was then removed and the mixture was cooled to ~80° C. The resulting nanocrystals were collected by centrifugation in a 3:1 mixture of isopropanol and toluene. The precipitate was then redispersed in ~40 ml toluene to form a stable ink solution. The resulting CZTS nanocrystals were identified as $Cu_{1.48\pm0.08}Zn_{2.19\pm0.16}Sn_{0.91\pm0.03}S_4$ by EDX. A TEM image of the as-synthesized copper-poor and zinc-rich CZTS nanocrystals is shown in FIG. 4.

Example 3

CZTS Nanoparticle Synthesis Using Non-Coordinating Solvents

CZTS nanoparticles synthesis may employ the use of non-coordinating solvents (such as alkanes and alkenes) by using a desired amount of coordinating ligands (such as amines, carboxylic acids, ethers, phosphines, phosphonic acids and thiols). By way of example, a non-coordinating solvent, such as octadecene may be used with oleic acid as the coordinating ligand.

Figure 5:
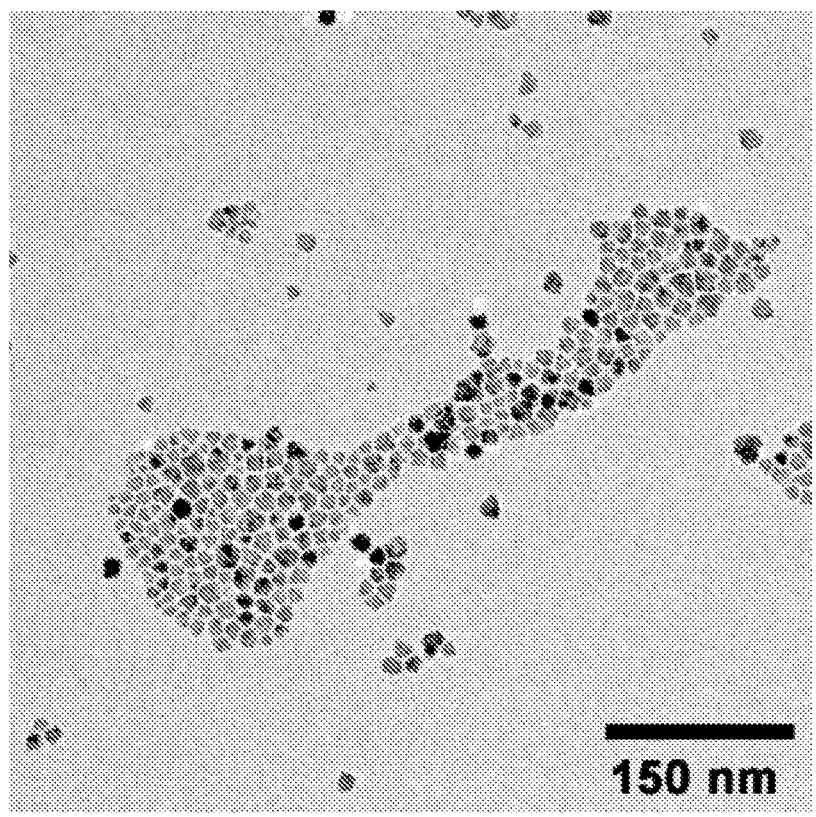
FIG. 5 depicts a TEM image of $Cu_{2.04\pm0.25}Zn_{0.89\pm0.19}Sn_{1.11\pm0.05}S_4$ nanoparticles synthesized using a non-coordinating solvent in conjunction with a coordinating ligand.

More specifically, 10 ml of octadecene (technical grade, Aldrich) was combined with 1.58 ml of oleic acid (technical grade, Aldrich) to form a reconstituted solvent solution to which a mixture of copper(II) acetylacetonate (1 mmol; 99.99%, Aldrich), zinc acetylacetonate (0.5 mmol; 99.995%, Aldrich), and tin(IV) bis(acetylacetonate)dibromide (0.5 mmol; 98%, Aldrich) was added. The resulting precursor solution was added to a 100 ml three neck flask connected to a Schlenk line. The reaction products were heated to ~130° C. under vacuum, degassed for 30 minutes, and purged with Ar several times. After raising the temperature to about 230° C., 2 ml of 1M sulfur solution (in oleylamine) was injected through the third neck. Following injection, the reaction mixture was allowed to proceed for 30 minutes for completion. The heating mantle was then removed and the mixture was cooled to ~80° C. The resulting nanocrystals were collected by centrifugation in a 3:1 mixture of isopropanol and toluene. The precipitate was then redispersed in ~40 ml toluene to form a stable ink solution. The resulting CZTS nanocrystals were identified as $Cu_{2.04\pm0.25}Zn_{0.89\pm0.19}Sn_{1.11\pm0.05}S_4$ by EDX. A TEM image of the CZTS nanocrystal synthesized in octadecene/oleic acid is shown in FIG. 5.

Example 4

Figure 6A:
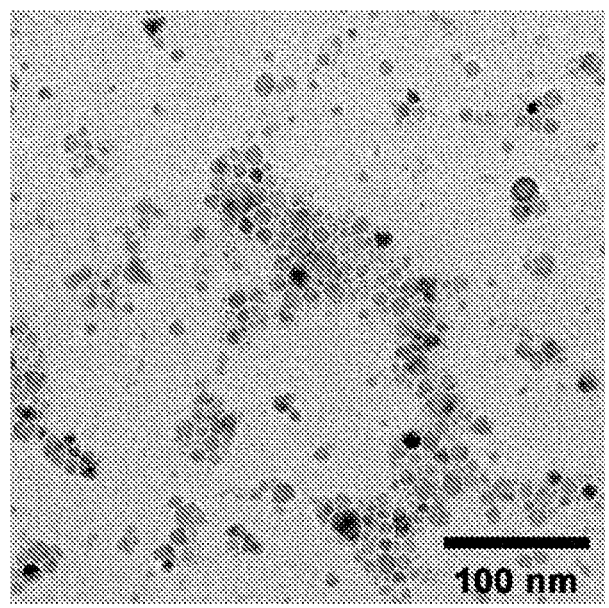
(FIG. 6A) and 260° C.
Figure 6B:
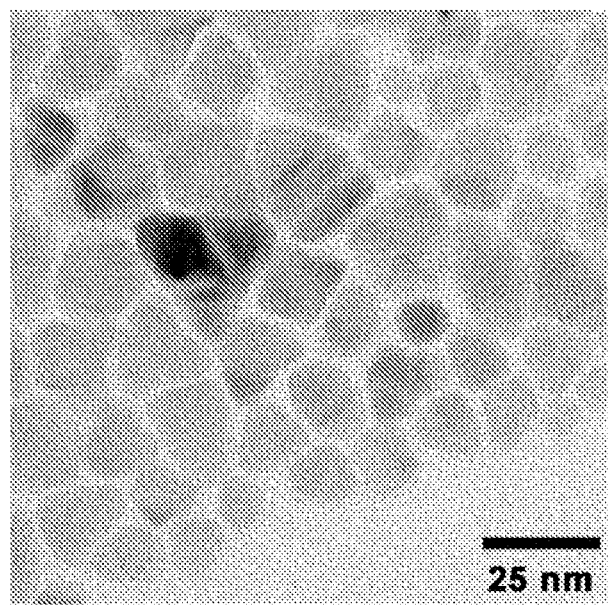
(FIG. 6B).

CZTS Nanoparticles Synthesis Using Non-Coordinating Solvents at Varied Temperatures The reaction temperature during CZTS nanoparticle synthesis can be varied from about 50° C. to about 350° C., preferably between about 150° C. to about 300° C. In this example, CZTS nanoparticles were synthesized at different temperatures in octadecene with oleic acid as the coordinating ligand using the synthesis procedure described in Example 3 above. TEM images of the CZTS nanocrystals synthesized at 200° C. (FIG. 6A) and 260° C. (FIG. 6B) are shown below.

Example 5

Formation of Thin Film Coating

In an exemplary embodiment, a thin film bilayer coating was formed on molybdenum coated soda lime glass using an ink solution comprising CZTS nanoparticles. CZTS nanoparticles as synthesized above were redispersed in toluene to form a stable ink solution having a nanoparticle concentration of about 10 mg/ml. Two layers (each of ~750 nm thick) of nanoparticles were deposited onto molybdenum coated soda lime glass. After depositing each layer, the particle layer was annealed at 350° C. for 1 hour in an inert (argon) atmosphere. As shown in FIG. 7, a dense CZTS nanoparticle film was obtained throughout the entire thickness of the film.

Example 6

Chalcogen Exchange with Se

In an exemplary embodiment, a thin film coating of CZTS nanoparticles on molybdenum coated soda lime glass was subjected to Se vapor chalcogen exchange. More specifically, following deposition of the bilayer coating of CZTS nanoparticles on molybdenum coated soda lime glass as described in Example 5, the sulfur (S) in the CZTS nanoparticle coating was exchanged with Se by annealing under Se vapor in a graphite box at temperatures between 350° C.-550° C. A PXRD pattern of Se exchanged CZTS nanoparticle thin film is shown in FIG. 8. After Se exchange, the diffraction peaks were found to be shifted to the left due to the increase in lattice parameters coincident with replacement of S by Se. Minor peaks, including peaks (101) and (202) are also evident in the Se exchanged film. Further, major peaks including (112) were sharpened after Se exchange, consistent with recrystallization and growth of the CZTS nanoparticles.

Example 6

Fabrication of Thin Film Solar Cells

A thin film solar cell was formed by depositing on molybdenum coated soda lime glass a CZTS nanoparticle-based bi-layer thin film coating (~1.5 micrometer). The thin film coating was annealed under argon at 350° C. for 1 hour after each coating as described previously. The CZTS nanoparticle-based thin film was then subject to Se exchange under Se vapor in a graphite box at 500° C. for 20 minutes to form a CZTSSe absorber film. The final CZTSSe absorber film was then further processed into a complete photovoltaic device following chemical bath deposition of cadmium sulfide (~50 nm), RF sputter of intrinsic zinc oxide (~50 nm), and RF sputter of indium tin oxide (~250 nm). After sputtering, the final device was scribed into areas of ~0.5 cm² with evaporated Ni/Al busbars.

Figure 9:
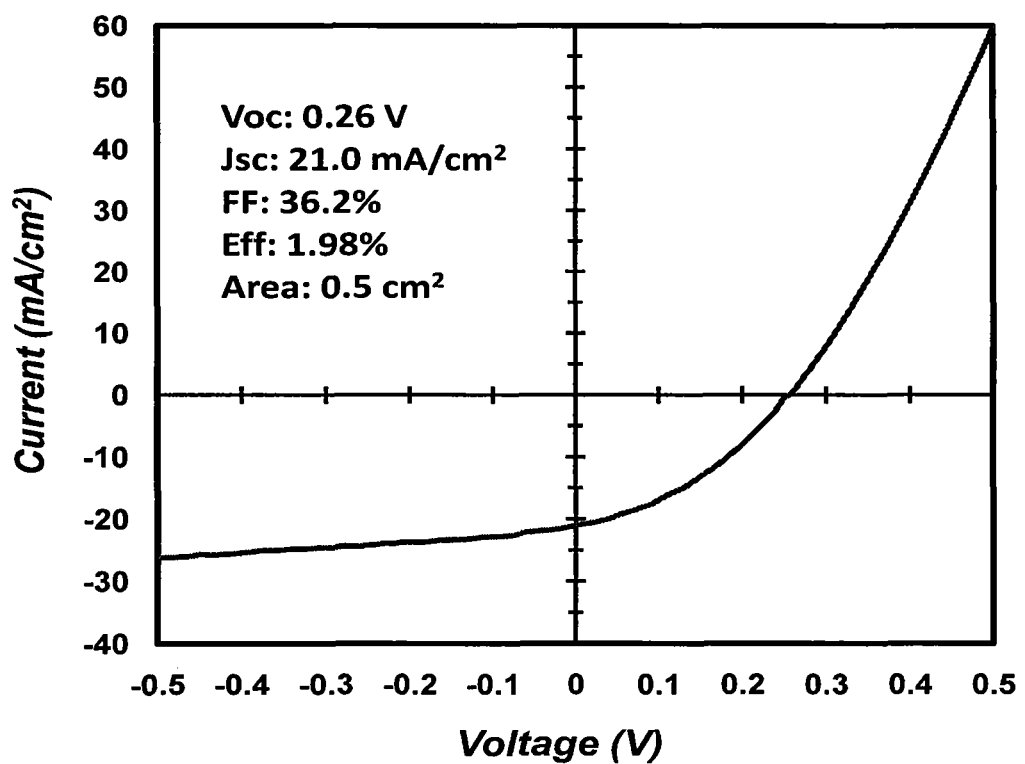
FIG. 9 depicts current vs. voltage characteristics in an exemplary photovoltaic device fabricated using CZTS nanoparticles.

FIG. 9 shows the current-voltage characteristics for a solar cells fabricated using this CZTSSe absorber film (Se exchanged at 500° C.). Current-voltage characteristics of prototype CZTSSe solar cells fabricated as described above were measured using an Oriel solar simulator with an AM1.5G filter set at 100 W/m² as calibrated using a certified monocrystalline Si solar cell. Initial devices fabricated using CZTSSe absorbers show device efficiencies up to 1.98% under AM1.5G illumination.

Although the description herein contains many specific details for the purpose of illustration, those of ordinary skill in the art will appreciate that many variations and alterations to the following details are within the scope of the disclosure and aspects of the invention. Further, it should be noted that any of the chemical elements, compounds, particles, nanoparticles, inks, coating treatments and methodologies described herein, and in related U.S. patent application Ser. Nos. 12/301,317, filed May 21, 2007, and 61/146,084, filed Jan. 21, 2009, may be utilized in any of the processes and composition described herein, even where they are not expressly identified or directed to a particular use, so long as the relied upon compositions and methods are applicable to the teachings and practice of the invention (or inventions) described herein. Moreover, the exemplary embodiments of the invention described below are set forth without any loss of generality to, and without imposing limitations upon, the claimed invention.

REFERENCES

1. Araki H, Mikaduki A, Kubo Y, Sato T, Jimbo K, Maw W S, Katagiri H, Yamazaki M, Oishi K, Takeuchi A. 2008. Preparation of Cu2ZnSnS4 thin films by sulfurization of stacked metallic layers. *Thin Solid Films* 517:1457-60.
2. Ennaoui A, Lux-Steiner M, Weber A, Abou-Ras D, Kotschau I, Schock H W, Schurr R, Holzing A, Jost S, Hock R, Voss T, Schulze J, Kirbs A. 2009. $Cu_2ZnSnS_4$ thin film solar cells from electroplated precursors: Novel low-cost perspective. *Thin Solid Films* 517:2511-4.
3. Guo Q, Agrawal R, Hillhouse H.2007. International Publication No. WO 2008/021604, published Feb. 21, 2008.
4. Guo Q, Agrawal R, Hillhouse H.2009. International Patent Application No. PCT/US2010/021636, filed Jan. 21, 2009.
5. Guo Q, Ford G M, Hillhouse H W, Agrawal R. 2009. Sulfide nanocrystal inks for dense $Cu(In_{1-x}Ga_x)(S_{1-y}Se_y)_2$ absorber films and their photovoltaic performance. *Nano Letters* 9:3060-652009.
6. Guo Q, Kim S J, Kar M, Shafarman W N, Birkmire R W, Stach E A, Agrawal R, Hillhouse H W. 2008. Development of $CuInSe_2$ nanocrystal and nanoring inks for low-cost solar cells. *Nano Letters* 8:2982-7.
7. Gur I, Fromer N A, Geier M L, Alivisatos A P. 2005. Air-stable all-inorganic nanocrystal solar cells processed from solution. *Science* 310:462-5.
8. Katagiri H, Jimbo K, Maw W S, Oishi K, Yamazaki M, Araki H, Takeuchi A. 2009. Development of CZTS-based thin film solar cells. *Thin Solid Films* 517:2455-60.
9. Katagiri H, Sasaguchi N, Hando S, Hoshino S, Ohashi J, Yokota T. 1997. Preparation and evaluation of $Cu_2ZnSnS_4$ thin films by sulfurization of E-B evaporated precursors. *Solar Energy Materials and Solar Cells* 49:407-14.
10. Koo B, Patel R N, Korgel B A. 2009. Synthesis of $CuInSe_2$ Nanocrystals with Trigonal Pyramidal Shape. *Journal of the American Chemical Society* 131:3134-35.
11. Luther J M, Law M, Beard M C, Song Q, Reese M O, Ellingson R J, Nozik A J. 2008. Schottky Solar Cells Based on Colloidal Nanocrystal Films. *Nano Letters* 8:3488-92.
12. Ma W, Luther J M, Zheng H M, Wu Y, Alivisatos A P. 2009. Photovoltaic Devices Employing Ternary $PbS_xSe_{1-x}$ Nanocrystals. *Nano Letters* 9:1699-703.
13. Repins I, Contreras M A, Egaas B, DeHart C, Scharf J, Perkins C L, To B, Noufi R. 2008. 19.9%-efficient ZnO/CdS/$CuInGaSe_2$ solar cell with 81.2% fill factor. *Progress in Photovoltaics* 16:235-9.
14. Scragg J J, Dale P J, Peter L M. 2009. Synthesis and characterization of $Cu_2ZnSnS_4$ absorber layers by an electrodeposition-annealing route. *Thin Solid Films* 517:2481-4.
15. Tanaka K, Moritake N, Uchiki H.2007. Preparation of $Cu_2ZnSnS_4$ thin films by sulfurizing sol-gel deposited precursors. *Solar Energy Materials and Solar Cells* 91:1199-201.
16. Tanaka T, Kawasaki D, Nishio M, Gu Q X, Ogawal H.2006. Fabrication of $Cu_2ZnSnS_4$ thin films by co-evaporation. *Physica Status Solidi C—Current Topics in Solid State Physics*, Vol 3, No 8 3:2844-7.
17. Tang J, Hinds S, Kelley S O, Sargent E H. 2008. Synthesis of Colloidal $CuGaSe_2$, $CuInSe_2$, and $Cu(InGa)Se_2$ Nanoparticles. *Chemistry of Materials* 20:6906-10.
18. Weber A, Krauth H, Perlt S, Schubert B, Kotschau I, Schorr S, Schock H W. 2009. Multi-stage evaporation of $Cu_2ZnSnS_4$ thin films. *Thin Solid Films* 517:2524-6.
19. Ramanathan, K., et al., *Properties of 19.2% efficiency ZnO/CdS/CuInGaSe2 thin-film solar cells*. Progress in Photovoltaics, 2003. 11(4): p. 225-230.

The invention claimed is:

1. A composition of matter comprising a plurality of discrete CZTSSe nanoparticles, said nanoparticles comprising copper, zinc, tin, and at least one chalcogen species, the composition of matter having the non-stoichiometric chemical formula $Cu_{2.04\pm0.25}Zn_{0.89\pm0.19}Sn_{1.11\pm0.05}(S,Se)_4$ or the non-stoichiometric chemical formula $Cu_{1.48\pm0.08}Zn_{2.19\pm0.16}Sn_{0.91\pm0.03}(S,Se)_4$.

2. The composition of claim 1, where the composition is formulated as a nanoparticle ink solution suitable for forming a thin film coating on a substrate.

3. The composition of claim 2, where the nanoparticle ink solution comprises a mixture of at least two different pluralities of particles, including a plurality of the discrete CZTSSe nanoparticles and a plurality of a second particle.

4. The composition of claim 3, where the second plurality of particles comprises a second CZTSSe nanoparticle.

5. The composition of claim 3, where second particle comprises a CZTSSe family particle comprising Cu, Zn, Sn, S, Se, or combination thereof.

6. The composition of claim 5, where the CZTSSe family particle comprises a metal, metal alloy, metal oxide, metal sulfide, metal selenide, or metal telluride.

7. The composition of claim 5, where the CZTSSe family particle comprises a binary, ternary, quaternary, or higher chalcogenide particle of Cu, Zn, Sn or combination thereof.

8. The composition of claim 3, where second particle comprises a CIGSSe nanoparticle.

9. The composition of claim 3, where the second particle comprises a multinary $I_B$-$II_B$/$II_A$-$IV_A$-$VI_A$ type nanoparticle.

10. A composition of matter according to claim 1 comprising the chemical formula $Cu_{2.12}Zn_{0.84}Sn_{1.06}(S,Se)_4$.

* * * * *